United States Patent [19]

Henry

[11] 3,896,478

[45] July 22, 1975

[54] MESA TYPE JUNCTION INVERTED AND BONDED TO A HEAT SINK

[75] Inventor: Raymond Henry, Paris, France

[73] Assignee: Thomson-CSF, Paris, France

[22] Filed: Feb. 14, 1974

[21] Appl. No.: 442,625

Related U.S. Application Data

[63] Continuation of Ser. No. 308,334, Nov. 21, 1972, abandoned.

[30] Foreign Application Priority Data

Nov. 26, 1971 France ............................ 71.42472

[52] U.S. Cl. ...................... 357/56; 357/55; 357/72; 357/81

[51] Int. Cl. ........................ H01l 11/00; H01l 15/00

[58] Field of Search ............ 317/234, 1, 4, 13, 235, 317/47, 47.1

[56] References Cited

UNITED STATES PATENTS

| | | | |
|---|---|---|---|
| 3,457,471 | 7/1969 | Moroney et al. | 317/234 A |
| 3,649,386 | 3/1972 | Murphy | 317/235 |
| 3,675,314 | 7/1972 | Levi | 317/235 |
| 3,706,840 | 12/1972 | Moyle et al. | 317/234 E |

*Primary Examiner*—Andrew J. James
*Attorney, Agent, or Firm*—Cushman, Darby & Cushman

[57] ABSTRACT

A new mesa type junction inverted and bonded to a heat sink is provided.

The "mesa" comprises a top face and flanks; the flanks are covered by a dielectric material grinded for obtaining an upper face in the plane of said top face; and at least a metallic layer is deposited upon said top face and bonded to said heat sink.

2 Claims, 6 Drawing Figures

MESA TYPE JUNCTION INVERTED AND BONDED TO A HEAT SINK

This is a continuation, of application Ser. No. 308,334 filed Nov. 21, 1972, now abandoned.

The present invention relates to junction devices of mesa type bonded to a heat sink.

To improve the dissipation of the heat liberated by a semiconductor junction in operation, it is well-known to inverte the mesa diode so that the junction are bonded to a base having good thermal conductivity and constituting a heat sink.

In the case of mesa diodes, it is therefore the terminal having the smallest cross-sectional area which is closest to said junction. Thus, it is this one which should be soldered to said base. Correspondingly, the operation is an extremely delicate one. Two soldering methods are in current use: brazing and thermocompression. In either case, the results are mediocre. In other words, brazing involves the risk that the brazing solder will flow over onto the flanks of the mesa structures and with thermocompression the compressive lead applied to the small-section terminal of the junction, runs the risk of driving said terminal into the base and consequently deforming it. In either case, the risk of short-circuiting is extremely high.

The object of the present invention is to overcome these drawbacks and the invention relates to a novel technology of manufacture of mesa-type junction semiconductor devices whose terminal of smallest cross-section is soldered to a base designed to dissipate heat.

According to the present invention, there is provided a semiconductor device constituted by at least one mesa type junction made upon a substrate, comprising a junction having a top face opposite to said substrate and flank, and covering said flank, a dielectric material grinded for obtaining an upper face in the plane of said top face; at least a metallic layer deposited upon said top face and a heat sink, bonded to said top face.

The present invention will be better understood from a consideration of the following explanations and the attached FIGS. in which.

In all the figures, similar references designate similar components.

Figure 1:
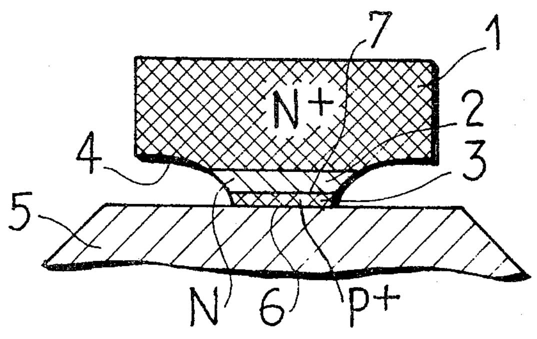
FIGS. 1 and 2 are explanatory diagrams.
Figure 2:
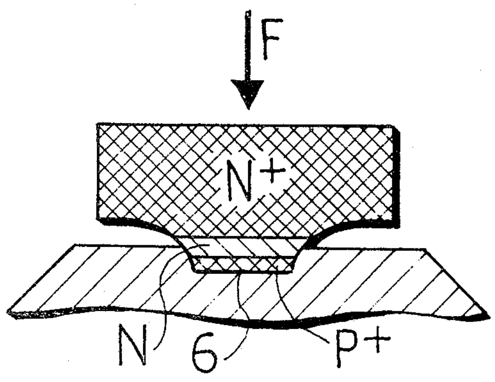

A semiconductor wafer comprising a substrate 1 of silicon having a given conductivity type, for example n+, has been shown in FIG. 1. On this substrate, there have been successively deposited the n-type layers 2 and p+ type layers 3, the latter having a very small thickness. A mesa etching made in the conventional manner forms the flank 4 and limits the surface of the junction; in accordance with a known method, the mesa diode is inverted and the layer 3 is thermocompression bonded to a base 5 of material having very good thermal conductivity, copper or silver for example and constituting a heat sink. In this operation, the terminal 6 of the junction having the smallest cross-sectional area and smallest thickness is placed upon the base. Thus, the distance separating the junction 7 from said base 5, is minimal. Unfortunately, as mentioned earlier and as shown in FIG. 2, during the application of the compression force F to the wafer, the terminal 6 of the diode penetrates into the base 5, distorting it. The depth of this penetration has been deliberately exaggerated in the drawing but is in actual fact far from being negligible. This penetration may lead to the short-circuiting of the junction 7. Even in the case of a small penetration, there is a high risk of fracturing the edges of the mesa. The case of soldering by a brazing operation has not been shown in any of the Figures but the risk that the brazing alloy arranged between the terminal 6 and the base 5 will climb up the flank 4, is obviously there and would lead to the same consequence as those attaching to soldering by a thermocompression operation. In accordance with the invention, to overcome these drawbacks, the semiconductor device is subjected to a supplementary manufacturing stage prior to being soldered to its base.

Figure 3:
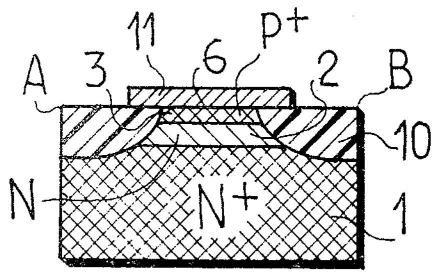
FIGS. 3 and 4 illustrate two variant embodiments of the device ready for soldering in accordance with the invention.

FIG. 3 schematically illustrates a first variant embodiment of a device in accordance with the invention. The flank 4 of the mesa are coated in a dielectric material 10 the upper surface AB of which is in the same plane as the terminal 6.

A metal deposit 11 having dimensions similar to or greater than those of the terminal 6, is produced in accordance with one feature of the invention, opposite to terminal 6 on the upper face AB of the assembly thus created. This metallised surface can be produced by a variety of methods all of which are known per se. The process may be vaporisation under vacuo of a metal or alloy, or again cathode spluttering, for example. If said first layer is too thin, it is possible to consolidate it to the desired thickness, by electrolytic deposition of metal.

Figure 4:
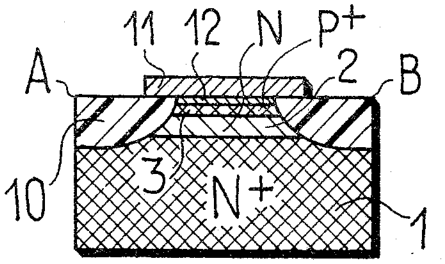

FIG. 4 schematically illustrates a second embodiment of a device in accordance with the invention. In this case, a first localised metal deposit 12 is produced upon the semiconductor layer 3, prior to the etching of the mesa. The coating of dielectric material 10 previously deposited upon the surface of the wafer is ground down until the metal deposit is exposed.

Subsequently, in accordance with the invention and as described in the case of the variant embodiment of the FIG. 3, the metallising 11 is produced if it is required that it has a larger cross-section than the metallising 12.

Figure 5:
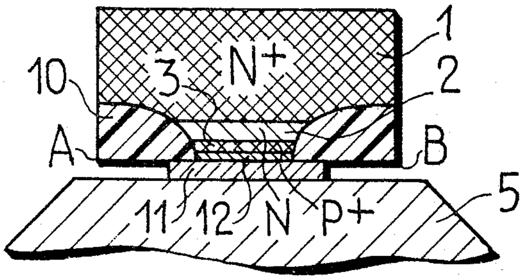
FIGS. 5 and 6 illustrate the soldering method in accordance with the invention.
Figure 6:
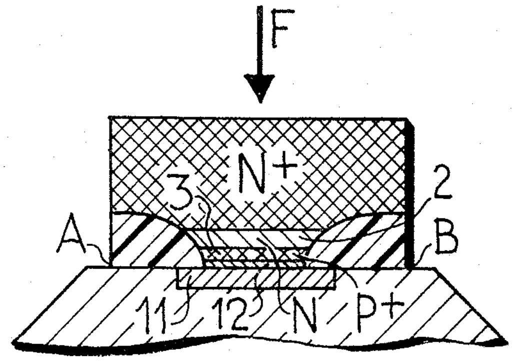

The wafer, whether it is like that of FIG. 3 or that of FIG. 4, is then ready to be inverted and bonded to the conductive base 5, in the manner shown in FIG. 5. Only the second variant embodiment of the invention (FIG. 4) has been shown, with its intermediate metal layer 12, but it goes without saying that the bonding method gives the same result in the case of a wafer in accordance with FIG. 3. The upper surface AB of the dielectric material forms a shoulder and limits penetration, protecting the junction against any risk of short-circuiting, as shown in FIG. 6.

The example described relates to soldering by thermocompression. This could equally well be done by brazing. In this case, the alloy is arranged between the metal deposit 12 and the base 5. During the heating phase while brazing is taking place, any runs or flashes which might be produced, are halted by the dielectric coating 10 which acts as an efficient insulating screen between such runs and the junction.

Although a n-p junction type silicon diode has been used to illustrate the present invention, it goes without saying that the invention applies in just the same way to diodes made of a semiconductor material other than silicon.

What I claim is:

1. Semiconductor device comprising: one mesa type junction made upon a substrate, said junction having flank, and terminal having a top face, said flank being embedded by a dielectric material having an upper face in the same plane of said top face, said semiconductor device further comprising at least a metallic layer having a first face being integral with said top face and a second face opposite to said first face, said second face being bonded to a heat sink so that said upper face forms a shoulder.

2. Semiconductor device according to claim 1 further comprising a metallic barrier layer deposited upon said top face and having a top surface, said upper face of said dielectric material being in the same plane of said top surface, said first face of said metallic layer being integral with said top surface, said second face being opposite to said top surface, said second face being bonded to a heat sink so that said upper face forms a shoulder.

* * * * *